Oct. 20, 1959 J. K. MOORE ET AL 2,909,674

HIGH FREQUENCY RELAY

Filed March 29, 1957 4 Sheets-Sheet 1

INVENTORS
JAMES KENNETH MOORE
STANLEY SCHNEIDER

BY

J. Walter Schilpp

ATTORNEY

INVENTORS
JAMES KENNETH MOORE
STANLEY SCHNEIDER
BY
J. Walter Schilpp
ATTORNEY

Oct. 20, 1959 J. K. MOORE ET AL 2,909,674

HIGH FREQUENCY RELAY

Filed March 29, 1957 4 Sheets-Sheet 3

INVENTORS
JAMES KENNETH MOORE
STANLEY SCHNEIDER

BY [signature]

ATTORNEY

Oct. 20, 1959 J. K. MOORE ET AL 2,909,674

HIGH FREQUENCY RELAY

Filed March 29, 1957 4 Sheets-Sheet 4

INVENTORS
JAMES KENNETH MOORE
STANLEY SCHNEIDER

BY J. Walter Schilpp
ATTORNEY

United States Patent Office 2,909,674

Patented Oct. 20, 1959

2,909,674

HIGH FREQUENCY RELAY

James Kenneth Moore, Downingtown, and Stanley Schneider, Newtown Square, Pa., assignors to Burroughs Corporation, Detroit, Mich., a corporation of Michigan Application March 29, 1957, Serial No. 649,548

7 Claims. (Cl. 307—88)

This invention relates to a high-frequency relay or switch useful in, thought not limited to, the control and processing of information in digital computers.

It is an object of the present invention to provide a high-speed relay or switch which is several orders of magnitude faster than the ordinary electromechanical relay, and which will operate at frequencies in excess of 0.5 megacycle.

Another object is to provide a high-frequency relay or switch which requires, for its operation, only D.-C. potentials and trigger pulses and which consumes but a relatively small amount of power.

Another object is to provide a high-speed relay or switch which is reliable in operation and whose component values are relatively non-critical.

Another object is to provide a high-speed gate for use in such a high-speed relay.

These and other objects of the invention are, in a preferred basic embodiment, accomplished by a network whose active elements are transistors, diodes, transformers and magnetic cores. A sampling pulse applied to the input of the network appears at one of two outputs according to the series-impedance condition of two diodes. By changing the impedance conditions of these diodes, the gates, which are pulse transformers, are switched, that is, a transformer gate which had been opened is closed and a transformer gate which had been closed is opened. Thus, the diode-selected transformer gates are the analogue of the "contacts" of an ordinary electromechanical relay.

In the preferred basic embodiment, the conditions of the diodes are controlled by a unit comprising, as active elements, the combination of a regeneratively-coupled transistor and a magnetic core. This control unit, in response to a data pulse applied thereto, changes the series-impedance of the diodes, the impedance of one diode being changed from a very large value to a very small value, and the impedance of the other being changed from a very small value to a very high value; and, as a result of this change, one of the transformer gates is opened while the other is closed. Thus, the control unit functions as the analogue of the "coil" of an ordinary electromechanical relay.

While the foregoing is a summary, the invention will be best understood from a consideration of the following detailed description taken together with the drawing wherein.

Figure 1:
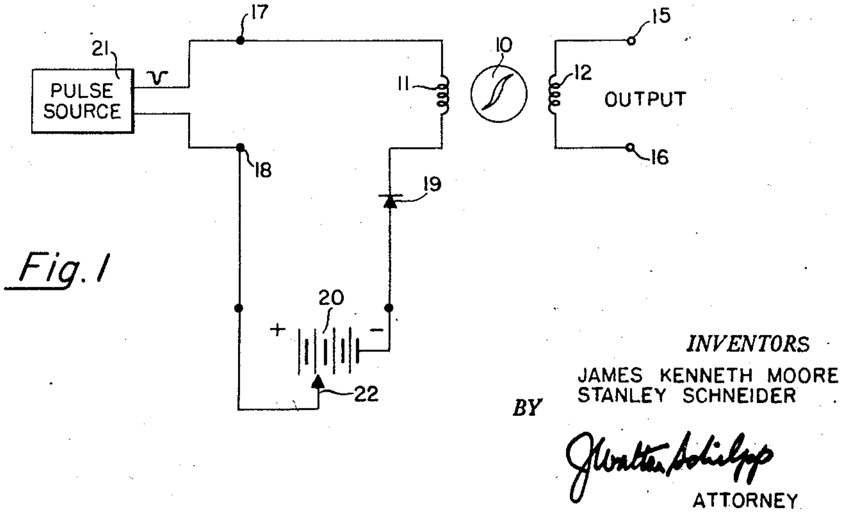
Fig. 1 is a schematic of the basic diode-transformer gate used in the circuit of the present invention.

Referring now to Fig. 1, there is shown a pulse transformer 10 having primary winding 11 and secondary winding 12, the secondary winding 12 being connected to a pair of output terminals 15 and 16. One end of primary winding 11 is connected to one input terminal 17 and the other end is connected to the other input terminal 18 through a diode 19 and a battery 20, the positive terminal of the battery being connected to the input terminal 18 and the negative terminal being connected to the anode of the diode. Battery 20 serves to provide a voltage which may be referred to as the control voltage. Connected to the input terminals 17, 18 is a source of negative pulse voltage 21.

The circuit shown in Fig. 1 and just described represents the basic diode-transformer gate used in the circuit of the present invention. It will be seen that if the control voltage is reduced to zero, as by moving the arm 22 all the way to the right, the diode 19 will offer a very low impedance to an applied negative pulse from source 21 and a relatively large current, whose value is limited mostly by the impedance of the transformer 10, will flow through the winding 11, and an output pulse will be produced at the terminals 15, 16.

If, now, we move the adjustable arm 22 to the left until the applied battery voltage is larger than the maximum value of the negative input pulse from source 21, then the input pulse will find the diode 19 back-biased and the diode will offer a very high impedance to the flow of current therethrough. The current through the winding 11 will then be small and only a small noise signal will appear at the output terminals 15, 16.

It will be seen that the circuit of Fig. 1 is the equivalent of a single-pole single-throw switch which is controlled by the value of the control voltage supplied by the battery 20. With the control voltage zero, the switch is closed and the gate is open to the passage of a signal therethrough; with the control voltage larger than the input signal, the switch is open and the gate is closed.

While the diode-transformer gate or switch of Fig. 1 has been shown as operating with negative input pulses, it will be understood that the circuit will just as readily operate with positive input pulses; however, in this case, the polarity of the control voltage and of the diode should be reversed from that shown in Fig. 1.

Figure 2:
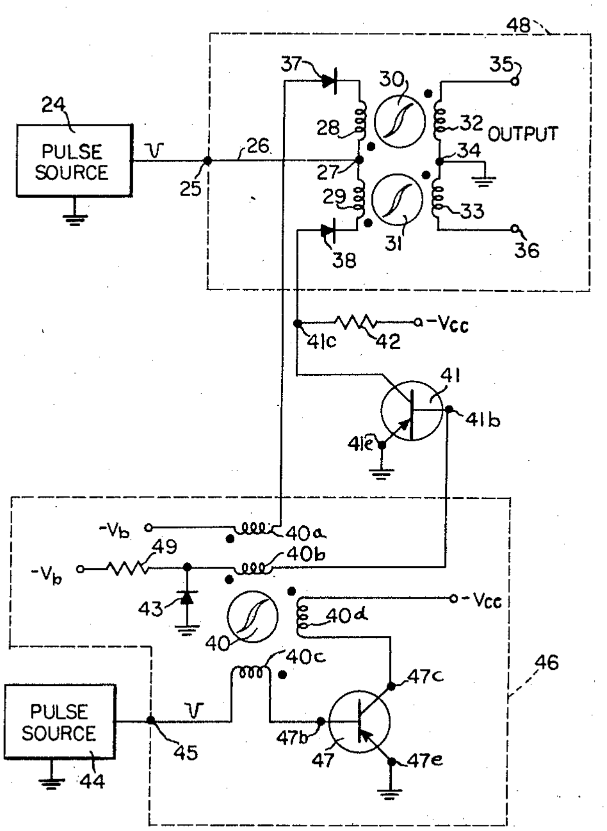
Fig. 2 is a schematic of a preferred embodiment of the high-speed relay of the present invention in which the diode-transformer gate is controlled by a gate-control unit comprising a regeneratively-coupled transistor and magnetic core.

Referring now to Fig. 2, there is shown a preferred form of a high-frequency relay embodying the present invention and incorporating the diode-transformer gate whose basic form is illustrated by the circuit shown in Fig. 1 and just described above. In Fig. 2, a source of negative pulse voltage 24 is connected to an input terminal 25. Terminal 25 is connected by way of lead 26 to a common junction 27 of primary windings 28 and 29 of a pair of pulse transformers 30 and 31, respectively. The secondary windings 32 and 33 of the pulse transformers have one end connected to a grounded common junction 34, and their other ends connected to the output terminals 35 and 36, respectively. The outer ends of primary windings 28 and 29 are connected to the cathodes of diodes 37 and 38, respectively. The anode of diode 37 is connected through a first winding 40$a$ of a magnetic core 40 to a source of negative D.-C. voltage $-V_b$. The anode of diode 38 is connected to the collector 41$c$ of a transistor 41 whose emitter 41$e$ is connected directly to ground. The collector 41$c$ is also connected through a resistance 42 to a source of negative D.-C. voltage $-V_{cc}$. The base 41b of transistor 41 is connected through a second winding 40b of magnetic core 40 and a current-limiting resistor 49 to the negative D.-C. voltage source $-V_b$. A diode 43 is connected between ground and the junction of winding 40b and resistor 49, the anode being the grounded electrode.

A source 44 of negative trigger pulse is connected to input terminal 45 of a control unit 46 shown within the dotted rectangle. Within the control unit 46, terminal 45 is connected through a third winding 40c of magnetic core 40 to the base 47b of a transistor 47 whose emitter 47e is grounded and whose collector 47c is connected by way of a fourth winding 40d of core 40 to a source of negative D.-C. voltage $-V_{cc}$.

The transistors 41 and 47 of Fig. 2 are shown to be PNP transistors. However, the circuit of the invention is not limited to this conduction type, and, if desired, NPN transistors may be used, in which case it is necessary that the polarities of the source voltage and of the applied pulse signals be the reverse of those shown in Fig. 2. Alloy junction transistors are preferred over surface barrier transistors because of the wider voltage swing of the alloy junction type; however, surface barrier transistors may also be used, at least in certain cases.

The windings of the pulse transformers 30 and 31, and of the magnetic core 40, have polarities indicated in Fig. 2 by the dots. For example, if conventional current is driven into the non-dotted end of a winding, the voltage induced in the other winding or windings on the same core is of a polarity to drive current out of the non-dotted end of such other winding or windings. Thus, windings 40d and 40c are regeneratively coupled.

The operation of the circuit of Fig. 2 will now be described. Assume first that no trigger pulse has been applied to terminal 45 of control unit 46. The base-emitter junction of transistor 47 is then zero biased and the active elements of the control unit 46, comprising the transistor 47 and the magnetic core 40, are in a quiescent state. Under these conditions, the other transistor 41, which may be referred to as the gate transistor, is forward biased and bottomed, i.e., is conducting at saturation, due to the negative voltage from source $-V_b$ connected to its base through the winding 40b. The diode 43, whose principal function is to provide a low impedance path for the reverse current developed by winding 40a, as will be described, also functions as a clamping diode which limits the negative voltage applied to the base of transistor 41 to a value determined by the drop across the diode.

With transistor 41 bottomed, the potential of the collector 41c of gate transistor 41 is then substantially equal to that at its emitter 41e since the collector-to-emitter internal impedance of the transistor 41 when bottomed is but a few ohms. Actually, the potential difference between the collector and emitter of the transistor 41 when bottomed may be of the order of 0.1 volt, but this is negligible and, for the purposes of this description, the collector of a bottomed transistor will be assumed to be at the potential of the emitter. Thus, the anode of diode 38, which is tied directly to the collector 41c, is at ground potential when transistor 41 is bottomed.

It will be seen, then, that when the control unit 46 is not triggered, the gate-transistor 41 is bottomed and the anode of diode 38 is at ground potential. The other diode 37, however, is back-biased since its anode is connected to the negative voltage source $-V_b$.

If, when the control unit 46 is in the non-triggered condition described above, a negative sampling pulse, whose peak amplitude is less negative than the value of the negative voltage source $-V_b$, be applied from source 24 to the input terminal 25, the sampling pulse will see the path which includes the diode 38 as a very low impedance path and the path which includes the diode 37 as a very high impedance path. Accordingly, the sampling pulse will drive current through the primary winding 29 of the pulse transformer 31 but not through the primary winding 28 of pulse transformer 30, and an output pulse will be developed across secondary winding 33 and will appear at the output terminal 36.

Consider now what happens when a negative trigger pulse is applied to terminal 45 of the control unit 46. The base-emitter junction of transistor 47 becomes forward biased by the pulse and collector current flows through winding 40d of core 40. The resultant change in flux induces a voltage in base winding 40c whose polarity is in a direction to increase the forward bias on the base-emitter junction of transistor 47. The collector current is thereby increased, which produces a further change in flux, which induces additional voltage in winding 40c. This further increases the forward bias on the base-emitter junction of the transistor. The action is regenerative, and the transistor 47 quickly bottoms.

The flux change resulting from the rise of collector current through the winding 40d also induces a voltage in the winding 40b. This voltage is of a polarity to oppose, and of a magnitude to cancel out, the negative voltage applied to the base 41b of transistor 41 from the source $-V_b$. The forward bias on the base-emitter junction of transistor 41 is thus removed and the transistor 41 cuts off. The potential of its collector 41c falls almost to that of the negative voltage source $-V_{cc}$ and diode 38 becomes back-biased by a voltage $-V_{cc}$ whose magnitude is larger than the peak amplitude of the negative sampling pulse from source 24.

The flux change resulting from the rise of collector current through the winding 40d also induces a voltage in the winding 40a which is of a polarity to oppose, and of a magnitude to cancel out, the negative voltage applied to the anode of diode 37 from the negative source $-V_b$. Thus, the back-bias on the diode 37 is removed.

If, when the circuit is in the triggered condition just described, a negative sampling pulse whose peak amplitude is less negative than the value of the negative voltage bias $-V_{cc}$ be applied from source 24 to the terminal 25, the sampling pulse will see the path which includes the diode 37 as a very low impedance but will see the path which includes the diode 38 as a very high impedance path. Thus, the pulse will drive current through the winding 28 of the pulse transformer 30, but not through the winding 29 of pulse transformer 31, and an output pulse will be developed at the output terminal 35.

It will be seen that, in the preferred basic relay circuit of Fig. 2, in response to a negative sampling pulse of proper amplitude applied to the input terminal 25, an output pulse will be developed either at the terminal 35 or at the terminal 36 depending upon the bias conditions of the diodes 37 and 38; and it has been shown that the diode bias conditions depend upon whether or not the control unit 46 has been triggered.

Figure 3:
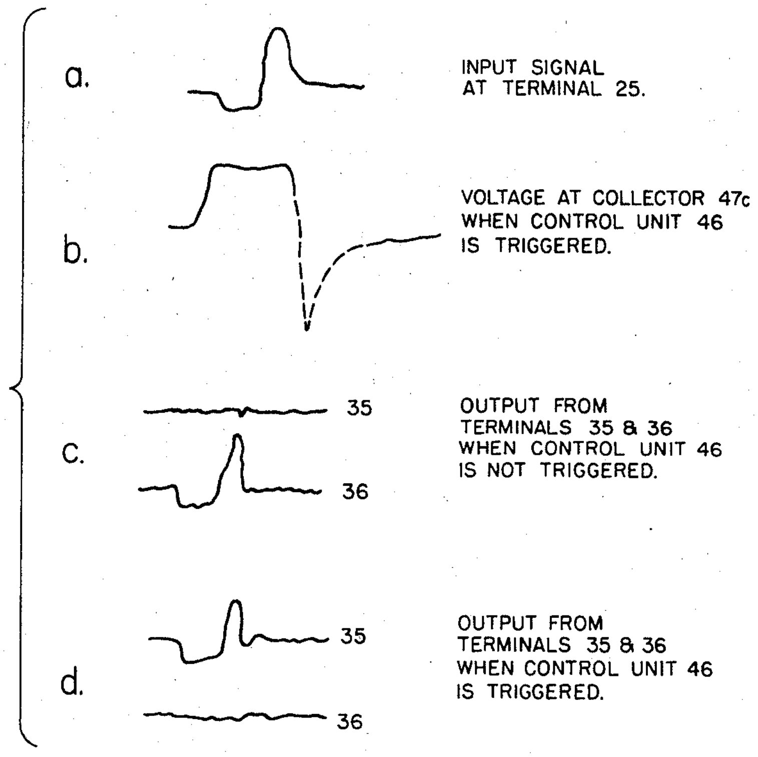
Fig. 3 shows graphically the waveforms at several points in the circuit of Fig. 2.

Referring now to Fig. 3, there is shown graphically at (*a*) a typical sampling signal to the input terminal 25; at (*b*) a typical voltage wave-form at the collector of transistor 47 when the control unit 46 is triggered; at (*c*) a typical output from the relay unit when the control unit is not triggered; and at (*d*) a typical output when the control unit is triggered.

Referring again to Fig. 2, that portion of the circuit which is enclosed within the dotted rectangle 48, and which comprises the diode-transformer gate or switch, is in effect the analogue of the contacts of an electromechanical relay. It will be now shown that these "contacts" of the high-speed relay of Fig. 2 may be cascaded in series, parallel, and combinations of these configurations, to implement a desired logic operation.

Assume, for example, that the logic for addition requires that there shall be an output if there be only one out of three inputs or if there be all three inputs. The notation for this logic is:

$$S=AB'C'+A'BC'+A'B'C+ABC \qquad \text{(Equation 1)}$$

where:

S is the sum output;

A, B and C are the three inputs; and

A', B' and C' are the absence of the inputs.

Figure 4:
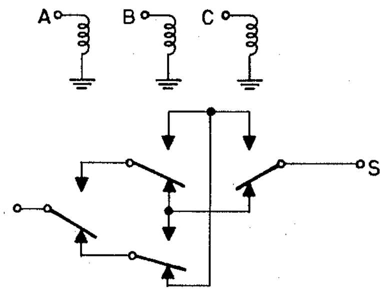
Fig. 4 is a schematic of one form of electromechanical multi-pole double-throw relay system.

The schematic of an electromechanical relay system which is the equivalent of the above Equation 1 is shown in Fig. 4. It will be seen from Fig. 4 that the relay system in a series-parallel combination of switches, the first order being a single-pole double-throw switch, the second order being a double-pole double-throw switch, and the third order being a single-pole double-throw switch.

Figure 5:
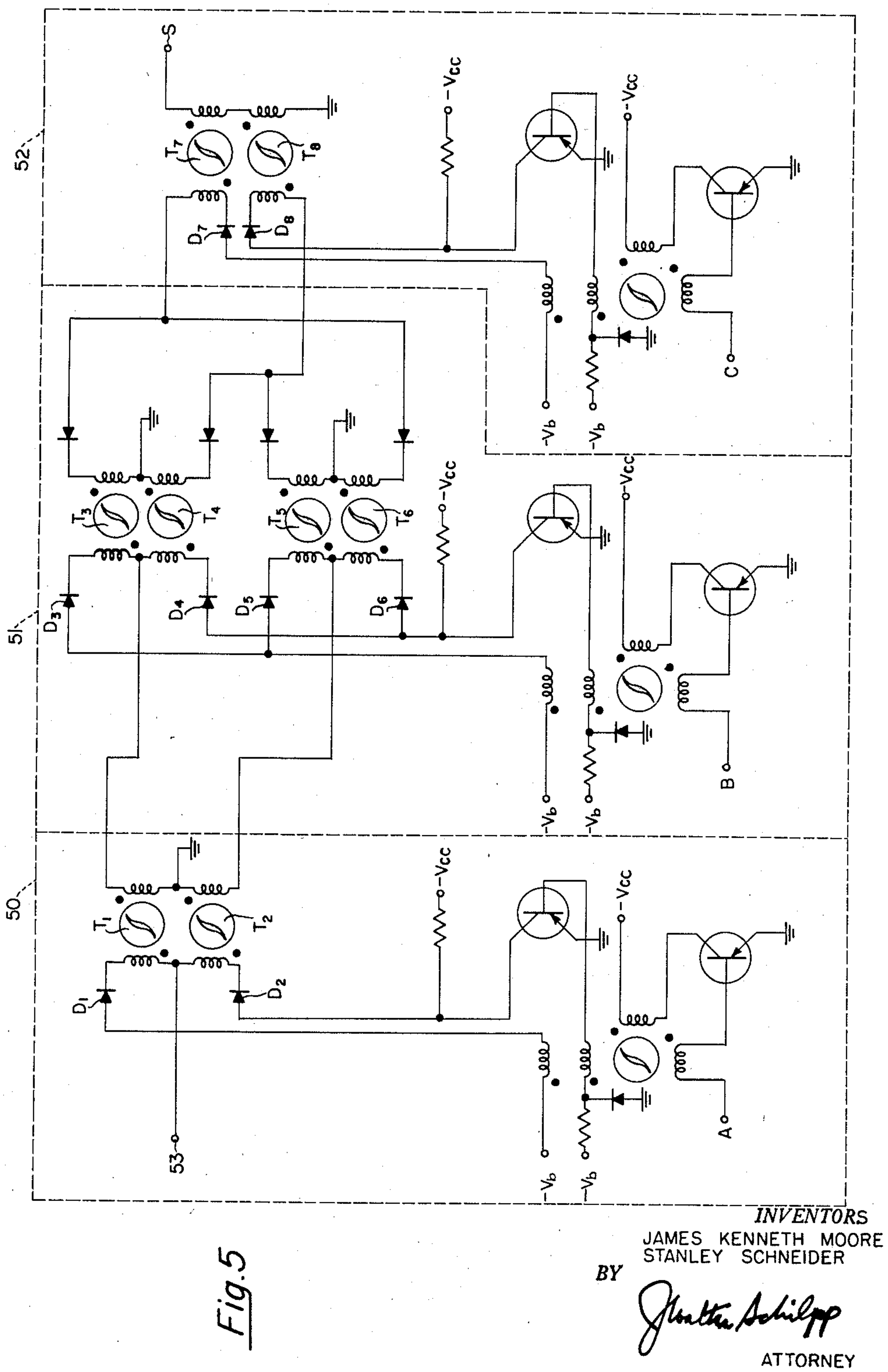
Fig. 5 shows a circuit which embodies the present invention and which is the full equivalent of the multi-pole double-throw relay system shown schematically in Fig. 4.

A system which incorporates the high-speed relay of the present invention and which is the full equivalent of the electromechanical relay system of Fig. 4 is shown in Fig. 5.

Referring now to Fig. 5, the first section of the system, shown within the dotted rectangle 50, is identical to that of the basic high-speed relay circuit of Fig. 2 and is the analogue of the single-pole double-throw switch of the first order of the electromechanical relay shown in Fig. 4.

The second section of the system of Fig. 5, shown within the dotted rectangle 51, is generally similar to the high-speed relay circuit of Fig. 2, but with the following modifications necessary to make this second section the analogue of the double-pole double-throw switch of the second order of the relay system of Fig. 4: Two additional pulse transformers and two additional diodes are connected in parallel with the two pulse transformers and the two diodes of the basic high-speed relay circuit; and four diodes are added to decouple the output circuits.

The third section of the system of Fig. 5, shown within the dotted rectangle 52, is, like the first section, substantially identical to the basic high-speed relay circuit of Fig. 2, the only exception being that the secondary windings of the pulse transformers are connected in series between the single output terminal S and ground.

The three sections of Fig. 5 are interconnected in the manner clearly shown in the drawing; it is not believed necessary to describe these connections in detail. It should suffice merely to point out that the dotted terminal of the secondary winding of pulse transformer $T_1$ of the first section 50 is connected to the common junction of the primary windings of pulse transformers $T_3$ and $T_4$ of the second section 51; that the non-dotted terminal of the secondary winding of pulse transformer $T_2$ of the first section 50 is connected to the common junction of the primary windings of pulse transformers $T_5$ and $T_6$ of the second section 51; that the dotted terminal of the secondary winding of pulse transformer $T_3$ and the non-dotted terminal of the secondary winding of pulse transformer $T_6$ of the second section 51 are connected together and to the non-dotted end of the primary winding of pulse transformer $T_7$ of the third section 52; and that the non-dotted terminal of the secondary winding of pulse transformer $T_4$ and the dotted terminal of the secondary winding of pulse transformer $T_5$ of the second section 51 are connected together and to the dotted end of the primary winding of pulse transformer $T_8$ of the third section 52.

The sampling pulse is applied at the terminal 53 and the output pulse, if any, is developed at the terminal S. The data or information pulses, identified in Fig. 5 as inputs A, B and C, are applied to the terminals of the control units of the sections 50, 51 and 52, respectively. For convenience of reference, the pulse transformers are identified in Fig. 5 as $T_1$ to $T_8$, inclusive, and the switch diodes are identified as $D_1$ to $D_8$, inclusive.

Let us now see whether the system of Fig. 5 will satisfy the requirements of Equation 1 given above.

The first term of the equation AB'C' requires that, in response to a sampling pulse, there shall be an output at S if there be an A pulse but no B or C pulse. In response to an A pulse, the transistor-core control unit of the first section 50 of Fig. 5 will be triggered, diode $D_1$ will be in its low-impedance state, $D_2$ will be in its high-impedance state, and the sampling pulse applied to the terminal 53 will pass through the pulse transformer $T_1$. With no B or C pulse applied, the transformer-core control units of the second and third sections 51, 52 will be in their quiescent state, the diodes $D_4$, $D_6$ and $D_8$ will be in their low-impedance states, the diodes $D_3$, $D_5$ and $D_7$ will be in their high-impedance states, and the output pulse from transformer $T_1$ of the first section will pass through transformer $T_4$ of the second section and then through transformer $T_8$ of the third section, thereby producing an output signal at the output terminal S. Thus, the first term of the equation is satisfied by the system of Fig. 5.

The second term of the Equation 1 is A'BC' and requires that there be a B pulse but no A or C pulse. Under these conditions, the control unit of the first section is non-triggered, the diode $D_2$ is in its low-impedance state, the diode $D_1$ is in its high-impedance state, and the sampling pulse applied to the terminal 53 passes through the pulse transformer $T_2$. The output from transformer $T_2$ passes through pulse transformer $T_5$ since the transistor-core control unit of the second section is triggered and the diodes $D_3$ and $D_5$ are in their low-impedance state. The output of transformer $T_5$ then passes through the pulse transformer $T_8$ of the non-triggered third section since the diode $D_8$ is in its low-impedance state, and an output pulse is produced at the terminal S. We see, then, that the system of Fig. 5 also satisfies the second term of the Equation 1.

The third term of Equation 1 is A'B'C and requires that there be a C pulse but no A or B pulses. Under these circumstances, the first and second sections are non-triggered and the low-impedance diodes are $D_2$, $D_4$ and $D_6$. The sampling pulse applied to the terminal 53 will, therefore, pass through the pulse transformer $T_2$ and then through the pulse transformer $T_6$. Then, because the transistor-core control unit of the third section is triggered, diode $D_7$ is in its low-impedance state, and the output pulse from transformer $T_6$ will pass through the pulse transformer $T_7$, thereby to produce an output signal at terminal S. We see, then, that the system of Fig. 5 also satisfies the requirements of the third term of Equation 1.

The final term of Equation 1 is ABC and requires that there be A, B and C pulses. Under these conditions, the control units of all three sections are triggered, the diodes which are in low-impedance states are $D_1$, $D_3$, $D_5$, and $D_7$, and the sampling pulse applied to terminal 53 will pass through the pulse transformer $T_1$, then through the pulse transformer $T_3$, and then through the pulse transformer $T_7$ to produce an output at terminal S. Thus, the final term of Equation 1 is satisfied.

It will be seen from the above that the system of Fig. 5 fully satisfies the requirements of Equation 1 and is, therefore, the full equivalent of the electromechanical relay system shown schematically in Fig. 4.

It will be understood that the system of Fig. 5 is illustrative merely of one form of multi-pole double-throw switch or relay which utilizes the basic high-speed relay of Fig. 2. Various other forms may be used to meet the various logic requirements.

The logic which is mechanized by the diode-selected transformer transmission gate or switch of the present invention corresponds directly to relay or switch logic and thus has the advantage that the very extensive techniques of systems synthesis and minimization familiar in relay system design may be used directly to simplify the system designer's analysis.

The diode-selected transformer gate or switch also has the advantage of having zero static power requirements; power is required only during the sampling period and when the switch is closed.

Another advantage of the diode-selected transformer gate of the present invention is that power attenuation per switch is relatively small. For a typical system, a pulse standardizer would be required only after about seven stages of logic.

Another advantage is that high speeds are possible. The delay per stage has a theoretical minimum value of between 1.2 to 5 millimicroseconds.

Still another advantage is that the use of transformer coupling provides isolation of the logic pulses from ground and allows the application of trigger pulses where desired. Furthermore, winding ratios may be chosen to give optimum power transfer.

Still another advantage is that the component values are relatively non-critical. For example, relatively wide changes in the maximum and minimum values of primary inductance and leakage will make relatively little change in pulse transmission; a 30% control of parameters should be quite satisfactory. And, insofar as the diodes are concerned, relatively large variations in the maximum drop at maximum current, and minimum drop at minimum current, will have relatively little effect. High-conduction diodes are, however, desirable in order to reduce power loss and signal attenuation.

With specific reference now to the magnetic core 40 of the control unit 46 of Fig. 2, the core 40 may be made of a square-hysteresis-loop material, preferably a metal tape, or the core may be made of non-square loop material such as a ferrite, depending on the particular application. For illustration, a non-square core may be used if the computer or other system of which the circuit of Fig. 2 is a part can supply a trigger pulse to the control unit for the required "on" time of the relay. If the system cannot supply a trigger pulse of proper duration, a square core must be used in order to produce the desired constant gating action within the relay unit itself. If a square core is used, action will terminate after full switching occurs, and if the switching flux and supply voltage are controlled, the switching time is quite precise. If a non-square core is used, termination of the action depends on many factors and the switching time will not be precise unless action is stopped by the application of a suitable voltage at the base of transistor 47. In either case, the voltage output is a square pulse having short rise and fall times and having a magnitude very nearly equal to the supply voltage times the turns ratio of the output winding to the input winding.

Where a square core is used, the control unit must be forcibly reset before the next regeneration can be started. If the core were not reset, the next pulse from source 44 would find the core already in the state to which the regenerative action of transistor 47 tries to drive the core. Accordingly, only a noise pulse would be generated, and such noise pulse would be insufficient to overcome the fixed biases on the diode 37 and on the base of transistor 41. Thus, the bias conditions of diodes 37 and 38 would not be reversed in response to the pulse from source 44. It is necessary, therefore, to reset the square core between each pulse from source 44. Means suitable for such resetting of the core are shown in Fig. 6.

Figure 6:
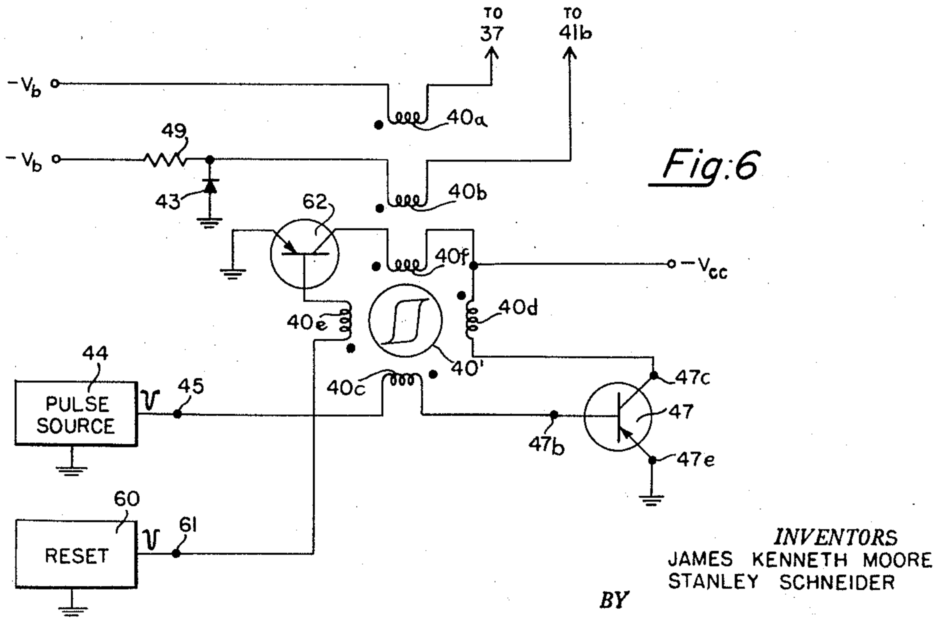
Fig. 6 shows a square-core gate-control unit having means for resetting the core.
Figure 7:
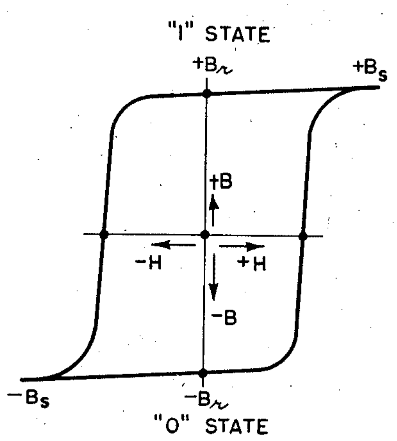
Fig. 7 shows an idealized square hysteresis loop.

Referring now to Fig. 6, there is shown a control unit corresponding to that portion of the circuit of Fig. 2 which is included within the dotted-line area 46, like parts being identified by like reference numerals. In Fig. 6, however, the core, which is identified by the reference numeral 40', has a square hysteresis loop characteristic, whereas core 40 in Fig. 2 has a non-square hysteresis loop characteristic. An idealized square loop characteristic is shown in Fig. 7.

Assume that in Fig. 6 when transistor 47 bottoms in response to a negative pulse from source 44, the current in the collector winding **40*d*, which is built up by regenerative action described hereinbefore, establishes a magnetizing force $+H$ which drives the square core 40' to a point of positive magnetic saturation $+B_S$. See Fig. 7. When the regenerative action of transistor 47 ends, the flux in core 40' falls back to its positive remanence level $+B_r$. Assume this positive state of remanence $(+B_r)$ to be designated arbitrarily as the "1" state. To shift the core 40' back to the "0" state, that is, to change the flux in core 40' from the positive remanence level $+B_r$ to the negative state of remanence $+B_r$, there is provided in Fig. 6 a source 60 of reset pulses. This source furnishes a negative reset pulse by way of terminal 61 and base winding 40*e* to the base of transistor 62. Such negative pulse forward biases the base-emitter junction of transistor 62 and initiates current flow in collector winding 40*f*. As in the case of the collector and base windings of transistor 47, and as indicated by the dot notations in Fig. 6, the collector and base windings of transistor 62 are regeneratively coupled so that the initial flow of current in collector winding 40*f* induces a voltage in base winding 40*e* of a polarity to further increase the forward bias on the base-emitter junction of transistor 62. This further increases the collector current, which causes a further change in flux, which induces an increase in the negative voltage applied to the base of the transistor 62. The action is regenerative and transistor 62 quickly bottoms. The collector current flowing through the winding 40*f* establishes a magnetizing force $-H$ which drives the flux in the core of 40' from the positive remanent level $+B_r$ to the point of negative magnetic saturation $-B_S$. See Fig. 7. When the regenerative action of transistor 62 ends, the flux level in the core 40' falls back to the point of negative magnetic remanence $-B_r$. Thus, the core 40'** is reset.

The non-square-core regenerative control unit shown in Fig. 2, and the square-core regenerative control unit shown in Fig. 6, are advantageously employed where it is desired to keep power requirements to a minimum. The square-core regenerative control unit of Fig. 6 is additionally advantageous where static, power-off, storage in square loop cores is desired.

Where the foregoing requirements are unimportant, the regenerative control units shown in Figs. 2 and 6 may be replaced with a flip-flop circuit, either complementing or non-complementing. While flip-flop circuits, complementing as well as non-complementing, are well known, there is shown in Fig. 8 an illustrative non-complementing flip-flop circuit connected in a manner to function as a control unit for the diode-transformer gate or switch.

Figure 8:
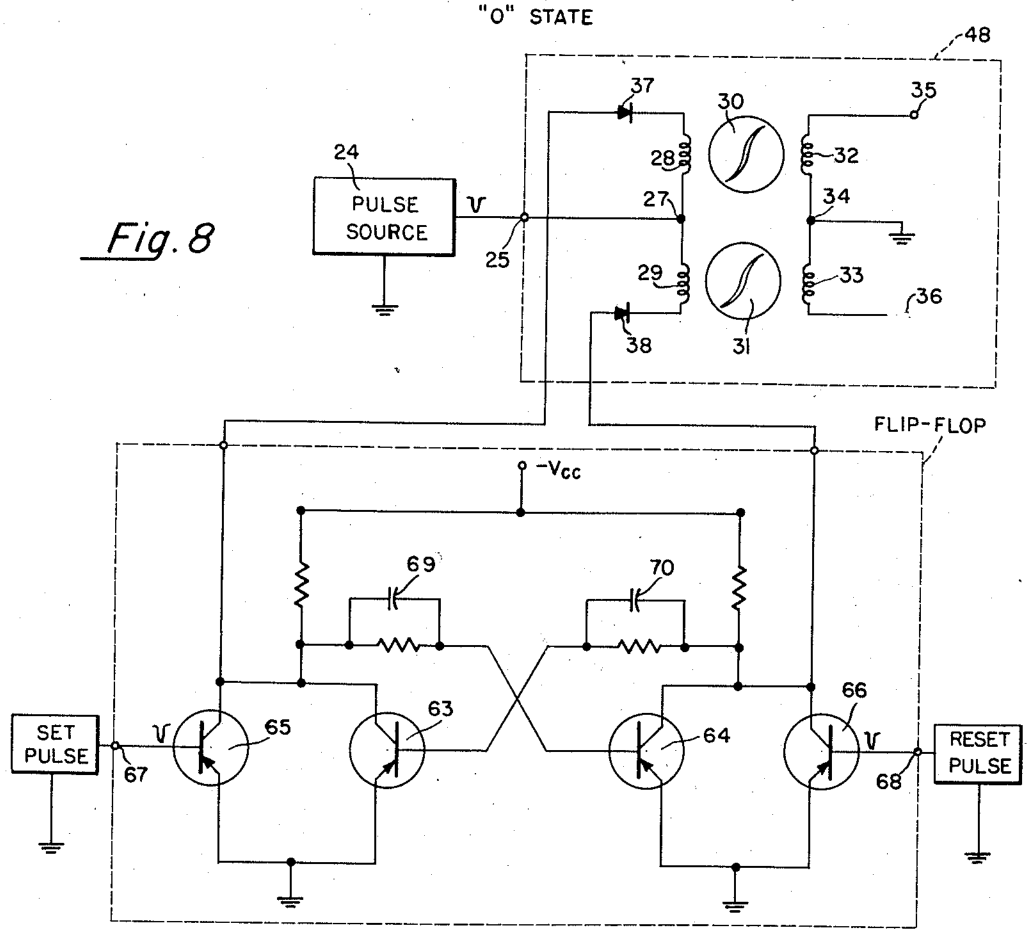
Fig. 8 shows a schematic of a relay circuit in which the diode-transformer gate is controlled by a flip flop.

Referring now to Fig. 8, the flip-flop circuit per se comprises the transistors 63 and 64, the base of each being connected to the collector of the other by an RC network as shown. The other two transistors, 65 and 66, serve "set" and "reset" functions.

The operation of the circuit of Fig. 8 will now be briefly described. Assume that flip-flop transistor 64 is "on" and that flip-flop transistor 63 is "off." Assume that with the flip flop in this state a negative pulse is applied to the "set" terminal 67. In response to such pulse, the transistor 65 turns "on" and quickly bottoms, i.e., conducts at saturation. Its collector potential rises sharply to substantially ground potential, and this voltage rise is applied through capacitor 69 to the base of flip-flop transistor 64. The base-emitter junction of transistor 64 is thereby reverse biased and transistor 64 turns "off." When flip-flop transistor 64 turns "off," its collector falls sharply to a negative potential $-V_c$ which is but slightly less than the potential of the negative D.-C. voltage source $-V_{cc}$. This negative-going voltage at the collector of "off" transistor 64 is transmitted through capacitor 70 to the base of flip-flop transistor 63 and forward biases its base-emitter junction. The flip-flop transistor 63 turns "on" and, thus, the potential at its collector is maintained at ground potential after the removal of the negative "set" pulse. This maintains transistor 64 "off," and, as a consequence thereof, transistor 63 remains "on."

It will be seen, then, that in response to a "set" pulse, the flip flop shifts from one of its two stable states to the other, namely, to the one in which the transistor 63 is "on" and the transistor 64 is "off." With the flip flop in this state, the diode 37 of the diode-transformer gate 48 is zero biased by the ground potential at the collector of "on" transistor 63, while the diode 38 of the said gate is reversed biased by the negative potential at the collector of "off" transistor 64. Accordingly, a negative pulse applied from the source 24 to the input terminal 25 of gate 48 will drive current through the primary winding 28 of transformer 30 and an output pulse will appear at the output terminal 35.

The flip-flop circuit will remain in the state above described and a pulse will be delivered from the output terminal 35 for each pulse applied to the input terminal 25.

If now a negative pulse be applied to the "reset" terminal 68, such "reset" pulse will forward bias the base-emitter junction of transistor 66, the transistor 66 will turn "on," and the potential of its collector will rise sharply to ground potential. This rise of voltage will be transmitted through the capacitor 70 to the base of the "on" flip-flop transistor 63, and transistor 63 will turn "off." The potential at the collector of transistor 63 will fall sharply to a negative voltage $-V_c$ slightly less negative than that of the negative D.-C. supply source $-V_{cc}$. The negative-going voltage at the collector of the transistor 63 is applied through capacitor 69 to the base of the flip-flop transistor 64, and the transistor 64 turns "on." Thus, the potential at the collector of transistor 64 is maintained at ground potential after the removal of the negative "reset" pulse, and this ground potential applied to the base of flip-flop transistor 63 maintains transistor 63 cut off. As a consequence thereof, transistor 64 is maintained "on."

It will be seen, then, that in response to the "reset" pulse, the flip-flop has changed its state and is now in the state wherein transistor 64 is "on" and transistor 63 is "off." With the flip-flop in this state, the diode 38 of the diode-transformer gate 48 is zero biased and the diode 37 is reversed biased. Consequently, a negative pulse applied to the input terminal 25 of gate 48 will drive current through the winding 29 of pulse transformer 31 and an output signal will be developed at output terminal 36. So long as the flip-flop remains in this state, a pulse will be delivered from the output terminal 36 for each input pulse applied to the terminal 25.

It will be seen from the foregoing that the diode-transformer gate 48 is controlled by the state of the flip-flop. In a copending application of the present joint inventors, Serial No. 649,418, filed on the same date as the present application, March 29, 1957, and assigned to the assignee of the present application, there is shown, described and claimed a circuit similar to that shown in Figure 8 but not claimed herein, and wherein specifically the output of the diode transformer gate is applied to the controlling flip-flop (or in the case of a shift register to the next succeeding flip-flop) to change the state of the flip-flop in response to each applied pulse.

What is claimed is:

1. A high-speed relay comprising: first and second transformers each having a winding; a first diode connected in series with said first-transformer winding; a second diode connected in series with said second-transformer winding; means for connecting a first source of bias voltage to reverse bias said first diode; means for connecting a second source of bias voltage to reverse bias said second diode; means including a normally-conducting first transistor for shorting out said second bias source to prevent said second source from reverse biasing said second diode; a control circuit comprising a magnetic core having a plurality of windings and a normally non-conducting second transistor whose output circuit includes one of said windings on said magnetic core; means for applying a trigger pulse from an external source to said second transistor to turn "on" said transistor, thereby to develop pulse voltages across said magnetic-core windings; means for utilizing the pulse voltage developed across a magnetic-core winding to cancel out said first bias voltage, thereby to remove said reverse bias from said first diode; means for utilizing the pulse voltage developed across another magnetic-core winding to cut off said normally conducting first transistor, thereby to remove said short across said second bias source and to restore the reverse bias on said second diode; means for applying to said first and second transformer windings from an external source a sampling pulse of same polarity but smaller voltage than either said first or second bias voltages, said sampling pulse being applied to said first and second transformer windings in a direction to forward bias the diode in series with one of said windings and to reduce the reverse bias on the diode in series with the other; and means for deriving an output signal from that one of said transformers whose winding includes the series diode which is forward biased by said sampling pulse.

2. A high-speed relay comprising: first and second transformers each having a winding; a first diode connected in series with said first-transformer winding; a second diode connected in series with said second-transformer winding; means for connecting a first source of bias voltage to reverse bias said first diode; means for connecting a second source of bias voltage to reverse bias said second diode; means, including a normally-conducting first transistor, for shorting out said second bias source, thereby to remove the reverse bias from said second diode; means, including the combination of a normally non-conducting second transistor and a magnetic core whose flux state is changed in response to the conduction of said second transistor, for developing in response to a trigger pulse from an external source a first pulse voltage to cancel out said first bias voltage, thereby to remove said reverse bias from said first diode, and for developing a second pulse voltage to cut off said normally-conducting first transistor, thereby to remove said short from across said second bias source and to restore the reverse bias on said second diode; means for applying to said first and second transformer windings from an external source a sampling pulse of same polarity as said first and second bias voltages but of smaller magnitude, said sampling pulse being applied to said first and second transformer windings in a sense to forward bias one of said diodes and to reduce the reverse bias on the other of said diodes; and means for deriving an output signal from that one of said transformers whose winding includes the series diode which is forward biased by said sampling pulse.

3. A high-speed relay comprising: first and second transformers each having a winding; a first diode connected in series with said first-transformer winding; a second diode connected in series with said second-transformer winding; means for connecting a first source of bias voltage to reverse bias said first diode; means for connecting a second source of bias voltage to reverse bias said second diode; means including a normally-conducting transistor for shorting out said second bias source to prevent said second source from reverse biasing said second diode; a control circuit; means for applying a trigger pulse from an external source to said control circuit to develop first and second pulse voltages; means for utilizing said first pulse voltage to cancel out said first bias for voltage and for utilizing said second pulse voltage to cut off said normally conducting transistor, thereby to remove said reverse bias from said first diode and thereby to remove said short from across said second bias source to restore the reverse bias on said second diode; means for applying a sampling pulse from an external source to said first and second transformer windings to forward bias one of said diodes and to reduce the reverse bias on the other diode; and means for deriving an output signal from that one of said transformers whose winding includes the series diode which is forward biased by said sampling pulse.

4. A high-speed relay comprising: first and second transformers each having a winding; a first diode connected in series with said first-transformer winding; a second diode connected in series with said second- transformer winding; means for connecting a first source of bias voltage to reverse bias said first diode; means for connecting a second source of bias voltage to reverse bias said second diode; means comprising a normally-conducting first transistor for zero-biasing said second diode by shorting out said second bias source, thereby to remove the reverse bias from said second diode; means responsive to a trigger pulse from an external source for developing a first pulse voltage to cancel out said first bias voltage, thereby to remove said reverse bias from said first diode, and for developing a second pulse voltage to cut off said normally-conducting first transistor, thereby to remove said short across said second bias source and to restore the reverse bias on said second diode; means for applying a sampling pulse from an external source to said first and second transformer windings in parallel in a direction to forward bias the zero-biased diode and to reduce but not overcome the reverse bias on the other of said diodes; and means for deriving an output signal from that one of said transformers whose winding include the series diode which is forward biased by said sampling pulse.

5. A high-speed relay comprising: a first path having in series a first transformer winding, a first diode and a first source of bias-voltage of a polarity to back-bias said diode; a second path having in series a second transformer winding, a second diode, and a second source of bias voltage of a polarity to back-bias said second diode; a transistor having its collector-to-emitter internal impedance connected across said second source of bias voltage; means normally biasing "on" said transistor, thereby to provide a low-impedance shunt across said second source of bias voltage and thereby to remove the back-bias from said second diode; means responsive to a control signal applied from an external source for developing a voltage to bias "off" said transistor, thereby to remove said low-impedance shunt from across said second bias source, whereby said second diode becomes back-biased; means responsive to said applied control signal for developing a voltage to oppose and to overcome the bias from said first bias source, thereby to remove the back-bias from said first diode; means for applying a sampling pulse from an external source across said first and second paths in parallel; and means for deriving an output signal from the transformer winding of that one of said paths whose diode has its back bias removed at the time the sampling pulse is applied.

6. A high-speed relay comprising: a first path having in series a first transformer winding, a first diode and a first source of bias-voltage of a polarity to back-bias said diode; a second path having in series a second transformer winding, a second diode, and a second source of bias voltage of a polarity to back-bias said second diode; a transistor having its collector-to-emitter internal impedance connected across said second source of bias voltage; means normally biasing "on" said transistor, thereby to provide a low-impedance shunt across said second source of bias voltage and thereby to reduce substantially the back-bias on said second diode; means responsive to a control signal applied from an external source for developing a voltage to bias "off" said transistor, thereby to remove said low-impedance shunt from across said second bias source, thereby to increase substantially the back-bias on said second diode; means responsive to said applied control signal for developing a voltage to oppose the bias from said first bias source, thereby to reduce substantially the back-bias on said first diode; means for applying a sampling pulse from an external source across said first and second paths in parallel; and means for deriving an output signal from the transformer winding of that one of said paths which includes a diode the back-bias of which is substantially reduced at the time the sampling pulse is applied.

7. A high-speed relay comprising: first and second transformers each having a winding; a first diode connected in series with said first-transformer winding; a second diode connected in series with said second-transformer winding; means for connecting a first source of bias voltage to reverse bias said first diode; means for connecting a second source of bias voltage to reverse bias said second diode; means including a normally-conducting transistor for providing a low-impedance shunt across said second bias source to reduce substantially the reverse bias on said second diode; a control circuit; means for applying a trigger pulse from an external source to said control circuit to develop first and second voltages; means for utilizing said first developed voltage to oppose said first bias voltage and for utilizing said second developed voltage to cut off said normally conducting transistor, thereby to reduce substantially said reverse bias on said first diode and to remove said low-impedance shunt from across said second bias source, thereby to restore the reverse bias on said second diode; means for applying a sampling pulse from an external source to said first and second transformer windings to forward bias one of said diodes and to reduce but not overcome the reverse bias on the other diode; and means for deriving an output signal from that one of said transformers whose winding includes the series diode which is forward biased by said sampling pulse.

References Cited in the file of this patent

UNITED STATES PATENTS

| | | |
|---|---|---|
| 2,683,819 | Rey | July 13, 1954 |
| 2,763,851 | Haynes | Sept. 18, 1956 |
| 2,768,312 | Goodale et al. | Oct. 23, 1956 |